(12) United States Patent
Pitts

(10) Patent No.: US 6,381,175 B2
(45) Date of Patent: Apr. 30, 2002

(54) METHOD AND SYSTEM FOR VALIDATING FLASH MEMORY

(75) Inventor: Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/755,328

(22) Filed: Jan. 5, 2001

Related U.S. Application Data

(60) Provisional application No. 60/175,353, filed on Jan. 10, 2000.

(51) Int. Cl.$^7$ ............................................... G11C 16/04
(52) U.S. Cl. .............................. 365/185.11; 365/185.33; 711/163
(58) Field of Search ....................... 365/185.11, 185.33; 711/163, 103

(56) References Cited

U.S. PATENT DOCUMENTS 5,751,637 A * 5/1998 Chen et al. ............. 365/185.33
6,172,906 B1 * 1/2001 Estakhri et al. ........ 365/185.11

* cited by examiner

*Primary Examiner*—Huan Hoang
(74) *Attorney, Agent, or Firm*—Dwight N. Holmbo; Wade James Brady, III; Frederick J. Telecky, Jr.

(57) ABSTRACT

A method for validating flash memory includes selecting for execution and executing, from a plurality of setup procedures available for the memory, a memory validation setup procedure setting respective values for a plurality of parameters that are also parameters set by execution of the other of the plurality of setup procedures. The method also includes determining that validation of a particular sector of the flash memory is desired and validating the particular sector of the flash memory, including examining the values of the plurality of parameters.

20 Claims, 3 Drawing Sheets

METHOD AND SYSTEM FOR VALIDATING FLASH MEMORY

This application claims priority under 35 USC§119(e)(1) of provisional application Ser. No. 60/175,353 filed Jan. 10, 2000.

TECHNICAL FIELD OF THE INVENTION

This invention relates generally to storage devices and more particularly to a method and system for validating flash memory.

BACKGROUND OF THE INVENTION

Flash memory is one type of non-volatile memory. A non-volatile memory retains its state after power has been terminated to the memory. A flash memory cell incorporates a floating gate with a sector, or group of flash memory cells, sharing a common control gate. Because a sector of flash memory cells shares a common control gate individual cells may not be erased. Rather a sector of cells is erased all at once. Erasing a sector of flash memory cells occurs by applying an erase pulse and measuring the threshold voltage of each memory cell until all cells have a threshold voltage below a certain level; all of the cells have not been erased until they all have a threshold voltage below a certain level. A problem with this procedure is that some cells may go into depletion (the threshold voltage is set too low) while the other memory cells are being erased. When a memory cell in a sector of flash memory is driven into depletion, no cell on the same bit line may be read because a depleted cell will source current, causing all bits in the sector to appear to store a "one" (indicating an erased bit).

To address this problem, some implementations of flash memory utilize algorithms as part of an erase procedure to confirm no bits are in depletion. If any bit is depleted, an algorithm is executed to correct the problem. These algorithms are referred to as a "compaction verify" algorithm and a "compaction" algorithm. A "compaction verify" algorithm determines the amount of current on a bit line after a sector is erased. A depleted bit is present if there is current on the bit line. Once it is determined that there is a depleted bit in a sector, the "compaction" algorithm executes. The compaction algorithm identifies the bit with a threshold voltage that is too low and corrects the voltage. These two algorithms are conventionally implemented as part of an erase command to verify that erasure has been performed properly.

A problem with the above-described procedure for ensuring flash memory cells are not depleted is that power may be terminated during an erase process before the "compaction verify" and "compaction" algorithms are executed. Therefore, it is possible that bits of flash memory will be in depletion upon powering up the memory. According to the above-described conventional systems, the problem is discovered only after data are unsuccessfully read from or written to a sector having the depleted bit, resulting in a system fault or interrupt.

SUMMARY OF THE INVENTION

Accordingly, a need has arisen for an improved method and system for validating flash memory. The present invention provides a system and method for validating flash memory that addresses shortcomings of prior systems and methods.

According to one embodiment of the invention, a method for validating flash memory includes selecting for execution and executing, from a plurality of setup procedures available for the memory, a memory validation setup procedure setting respective values for a plurality of parameters that are also parameters set by execution of the other of the plurality of setup procedures. The method also determining that validation of a particular sector of the flash memory is desired. In response the particular sector of the flash memory is validated, including examining the values of the plurality of parameters.

According to another embodiment of the invention, a flash memory module includes a flash bank, comprising a plurality of sectors of flash memory, and a flash memory control circuit. The flash memory control circuit comprises a flash state machine. The flash state machine is used for controlling a plurality of operations on the flash memory. The flash state machine comprises a stand-by unit for monitoring the state of at least one variable, and initiating execution of a particular one of a plurality of setup units in response to the state of the at least one variable. The flash state machine also includes an execution unit operable to selectively perform each of the plurality of operations in response to the state of the plurality of parameters, including validating a designated sector of the flash memory. The flash state machine also includes a validation setup unit operable to set the plurality of parameters such that the execution unit validates a designated portion of the flash memory. The flash state machine also includes a plurality of additional setup units, each operable to set the plurality of parameters such that the execution unit performs a respective one of the plurality of operations.

Embodiments of the invention provide numerous technical advantages. For example, in one embodiment of the invention, a procedure is provided for validating portions of flash memory, which may be improperly erased due to a power failure or inadvertent reset. The validation procedure may be executed by a host upon start-up or at other suitable times without first executing an erase command. A device incorporating such a validation procedure is less susceptible to system interrupts and therefore is more reliable. Furthermore, embodiments of the invention incorporate existing procedures, resulting in improved flash memory with little additional circuitry and expense.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1 through 5 of the drawings, like numerals being used for like and corresponding parts of the various drawings.

Figure 1A:
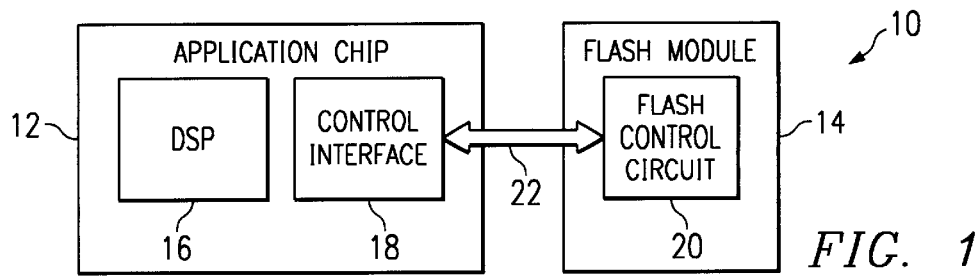
FIG. 1A is a block diagram of a system including an application chip and a stand-alone flash module according to the teachings of the invention.

FIG. 1A is a block diagram of a system 10 including an application chip 12 and a stand-alone flash module 14 according to the teachings of the invention. In this example, application chip 12 includes a digital signal processor 16, a control interface 18, and other additional circuitry (not explicitly shown). Flash module 14 includes a flash control circuit 20 and additional circuitry (not explicitly shown in FIG. 1A). Flash module 14 is described in greater detail in conjunction with FIGS. 2 through 5. Application chip 12 and flash module 14 cooperate through an interface 22 connecting control interface 18 with flash control circuit 20. System 10 is one example of a system incorporating a flash memory module constructed according to the teachings of the invention, such as flash memory module 14. In this example, a stand-alone flash module 14 communicates with an application chip 12 to provide memory for application chip 12. Example applications for application chip 12 are processors utilized in cell phones or automobile air bags.

According to the teachings of the invention, flash module 14 includes circuitry allowing validation of particular sectors of flash memory within flash module to ensure data may be properly written to and read from these sectors. In particular, flash module 14 includes circuitry that checks upon request for depleted bits of the flash memory within flash module 14 that may have become depleted during an incomplete erasure process. The teachings of the invention recognize that such verification is useful after power has been terminated or an inadvertent system reset occurred to system 10 or flash module 14 because such termination could have interrupted an erase process, resulting in depleted bits in the flash memory. Such a device allows for more reliable operation of flash module 14 and system 10, resulting in more robust flash operation. The teachings of the invention may be incorporated in any suitable system utilizing flash memory, including embedded flash memory such as that illustrated in FIG. 1B.

Figure 1B:
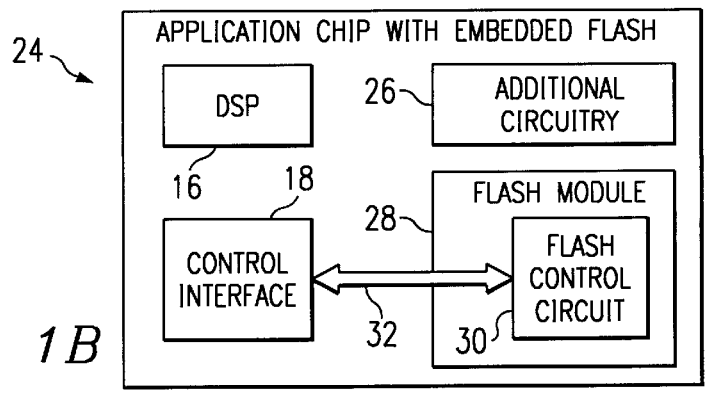
FIG. 1B is a block diagram of a system on a chip incorporating an embedded flash memory module according to the teachings of the invention.

FIG. 1B is block diagram of a system 24 on a chip incorporating an embedded flash memory module 28 according to the teachings of the invention. System 24 is another example of an implementation of flash memory according to the teachings of the present invention. System 24 includes a digital signal processor 16, a control interface 18, a flash module 28, and additional circuitry 26. Control interface 18 communicates with embedded flash module 28 through interface 32 to provide memory for system 24. Example applications in which system 24 may be used are processors in a wireless telephone or automobile air bags.

Figure 2:
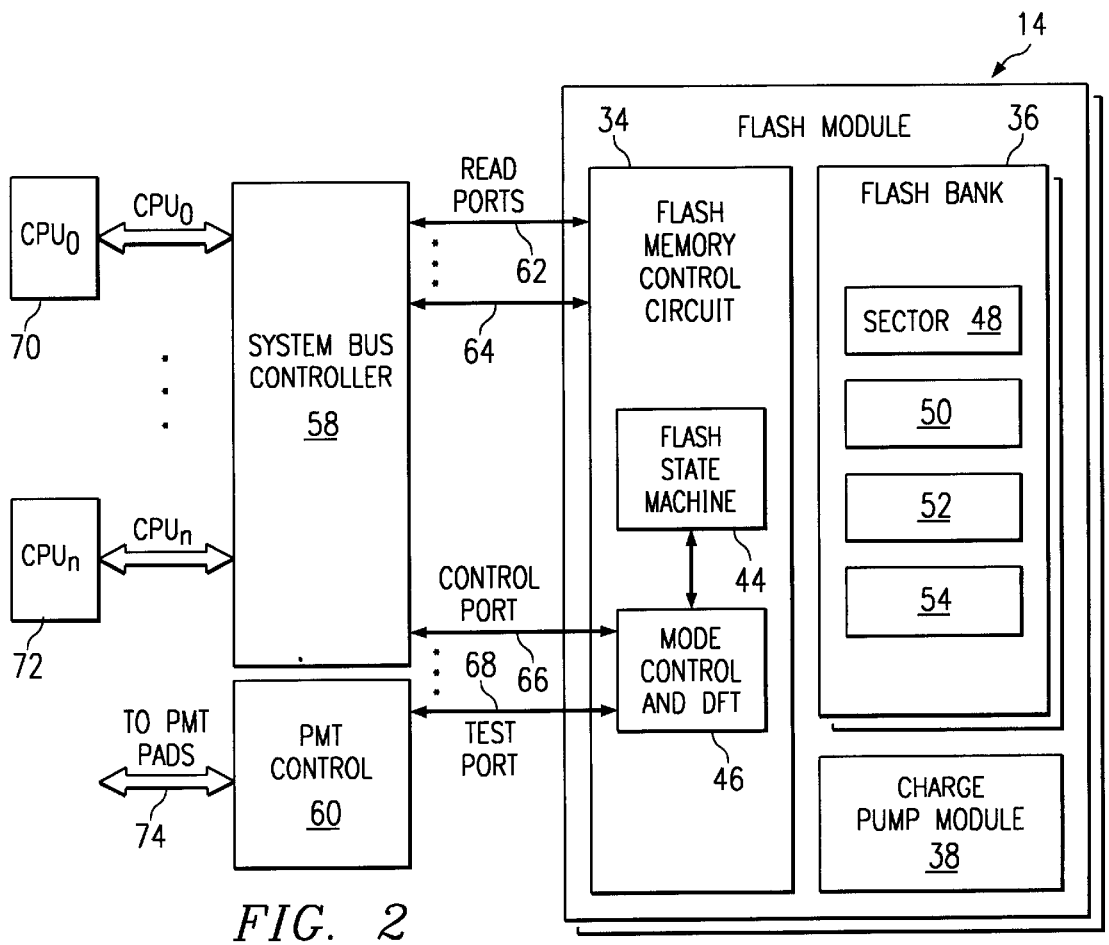
FIG. 2 is a block diagram of the flash memory module of FIG. 1A, showing additional details of the flash memory module.

FIG. 2 is a block diagram of flash memory module 14 of FIG. 1A, showing additional details of the flash memory module. Flash module 14 includes a flash memory control circuit 34, a flash bank 36, and a charge pump module 38. Flash memory control circuit 34 provides interface circuitry between hosts 70, 72, flash bank 36, and charge pump module 38. Flash bank 36 is a group of flash sectors that share input/output buffers, data paths, sense amplifiers and control logic (not explicitly shown). Charge pump module 38 includes voltage generators and associated control devices such as control logic, oscillators, and band gaps for use with flash bank 36. For simplicity of illustration only flash bank 36 is explicitly shown; however, flash module 14 may incorporate numerous flash banks.

Flash memory control circuit 34 cooperates with flash bank 36 and charge pump module 38 to perform a plurality of operations. These operations include programming (writing), erasing, validating, and reading flash memory. According to the teachings of the invention, flash memory control circuit 34 includes circuitry for implementing sector validation to confirm all sectors are validly erased and contain no depleted bits.

Control circuitry 34 is described in greater detail as follows: Flash memory control circuit 34 includes a data path 42, a flash state machine 44, and Mode Control and DFT unit 46. Data path 42 facilitates transferring of data between the host and flash banks in flash module 14, such as flash banks 36 and 40. Mode Control and DFT unit 46 is used to properly interface the flash module to the host and provide adequate flash module testability via a test interface.

Flash state machine 44 is a state machine that is implemented within flash memory control circuit 34 to automate program, erase, and perform sector validation operations on flash memory sectors, such as flash memory sector 46. Flash state machine 44 parses user commands received from host 70, 72 and allows flash memory within a module, such as flash module 14, to be erased or programmed with minimal requirements placed on host 70, 72. In this example, flash state machine is not used for read operations; however, other embodiments in which flash state machine 44 is used for read operations may be used. Command inputs received from hosts 70, 72 are written into a command register of state machine 44 (not expressly shown), which signals flash state machine 44 to execute appropriate setup units 94 (described below in conjunction with FIG. 3A) and to erase, program, or verify a designated portion of flash memory. Initiating an operation other than clearing the status of an execution unit 92 (FIG. 3A) causes a "BUSY" bit of the state machine 44 to go active. Flash state machine 44 returns to an inactive state upon completion of an operation performed on the flash memory.

According to the teachings of the invention, flash state machine 44 includes circuitry for, at the request of host 70, 72, verifying that sectors of flash memory within flash bank 36 have been properly erased and contain no depleted bits, such as depleted bits that may result from an improper erasure that may result from power being terminated during an erase process. Flash state machine 44 is described in greater detail below in conjunction with FIGS. 3A, 4, and 5.

The remainder of flash module 14 and its cooperation with host 70, 72 are described below as follows: Flash bank 36 includes a plurality of sectors 48, 50, 52, 54 and 56. A sector is generally a contiguous region of flash memory that must be erased simultaneously due to physical construction constraints of flash memory. Data are transferred between a data path at 42 and a host through data bases 62 and 64 and system path controller 58. System path controller 58 is connected to a plurality of hosts, such as central processing units mode 70 and 72. Control data are communicated between Mode Control and DFT unit 46 and host 70, 72 through control path 66 and system path controller 58. Test data are transferred between Mode control and DFT unit 46 and PMT control 60 over test path 68 for providing to PMT pads 74. PMT control 60 is used to allow adequate testing of the flash memory module on standard test equipment. The PMT pads are used to provide the signal interfaces between the test equipment and the flash module under test.

Figure 3A:
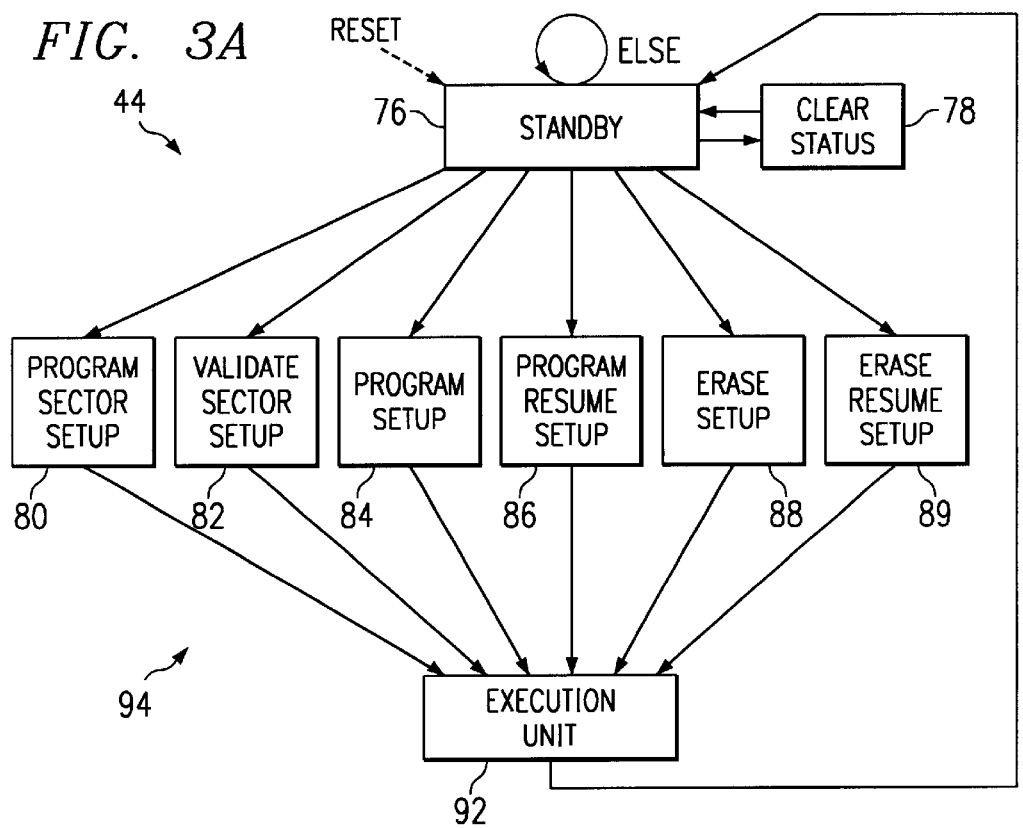
FIG. 3A is a block diagram showing functional units of the flash state machine shown in FIG. 2.

Additional details of flash state machine 44, which includes circuitry for allowing verification that sectors of flash memory within flash bank 36 have been properly erased and contain no depleted bits are described in conjunction with FIG. 3A. FIG. 3A is a block diagram of flash state machine 44. Flash state machine 44 includes a plurality of setup units including circuitry for performing various setup procedures for performing operations on flash memory within flash module 14. These units include a stand-by unit 76, a program sector setup unit 80, a validate sector setup unit 82, a program setup unit 84, a program resume setup 86, an erase setup unit 88, an erase resume setup unit 89, and an execution unit 92. Units 80, 82, 84, 86, 88, and 89 are referred to collectively as setup units 94. Upon execution, setup unit 94 sets the value of a number of parameters that designate particular steps to be performed by execution unit 92 to implement one of the desired operations available for flash memory module 14 (program, erase, validate, etc.). Execution unit 92 includes circuitry sufficient to perform the steps associated with the desired operation. Stand-by unit 76 implements a general wait state in which variables are continually monitored until a particular set of variables is designated, by for example, data received from host 70, 72 over control port 66, via mode control and DFT 46. When particular variables are set, a particular one of the plurality of setup units 94 is executed. A clear status unit 78 is utilized to reset the variables altered by operations of any of the other units 76 as needed.

Each of the setup units is described in greater detail below as follows: program sector setup unit 80 sets parameters used by execution unit 92 in programming a sector of flash memory, such as sector 46. Program setup unit 84 sets parameters used by execution unit 92 to program a particular sector of flash memory. Program sector setup 80 sets parameters used by execution unit 92 to program a sector of flash memory. Program resume setup unit 86 sets parameters used by execution unit in resuming programming of a word of a sector of flash memory after programming of the word or sector of flash memory has been interrupted. Erase setup unit 88 sets parameters used by execution unit 92 in erasing a sector of flash memory. Erase resume setup unit 89 sets parameters used by execution unit 92 in resuming an erase process that has been interrupted. Validate sector setup unit 82 is described in greater detail below. After parameters are set by setup units 94 for a particular operation, execution unit 92 executes a plurality of steps associated with that operation. The state of the parameters determines which steps are executed. Upon execution of the variety of functions performed by execution unit 92 (such as program sector, validate sector, program word, program resume, erase, or erase resume) program flow returns to standby unit 76 to await designation of a next function to perform by setting of a monitored variable.

Validate sector setup unit 82 sets parameters used by execution unit 92 in validating a sector of flash memory. By providing a plurality of setup units 94 selectively executable by the host 70, 72 from a standby state, any one of a plurality of operators may be performed on flash memory within flash module 14. Host 70, 72 may also specify the address of flash memory on which an operation is to be performed. Thus, for example, upon start up, validate sector setup unit 82 may be executed for sectors of flash memory commonly written to in order to verify that no bits within the sector have been depleted. Such a procedure is advantageous because it does not require executing an erase step in order to validate that no bits have been depleted.

Figure 3B:
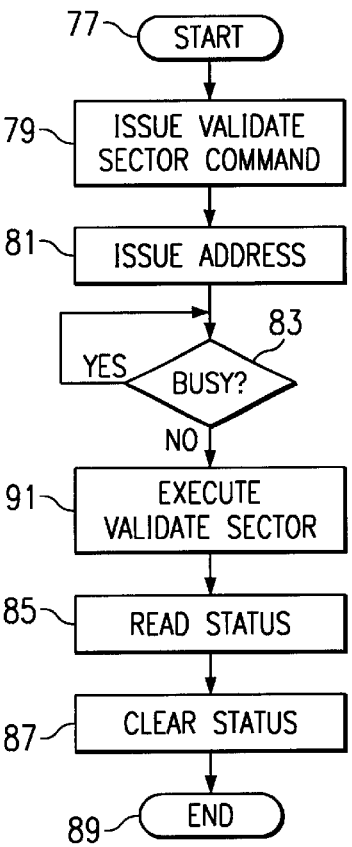
FIG. 3B is a flow chart illustrating the generation of a validate sector command by the host shown in FIG. 2 to validate the flash memory shown in FIG. 2.

FIG. 3B is a flow chart illustrating the generation of a validate sector command by host 70, 72. The process of initiating sector validation begins at a step 77. At a step 79, host 70, 72 issues a sector validate command over control path 66. In addition, host 70, 72 specifies an address for the sector to be validated at step 81. This address may be provided by host 70, 72 over data path 62 or 64. At a step 83, flash state machine 44 determines whether execution unit 92 is busy, and if so, the request is repeated until execution 92 is ready to accept the validate sector request. At a step 91, flash state machine 44 validates the designated sector of flash memory, as described below. At a step 85, host 70, 72 may read the status of the validation request, and at a step 87, host 70, 72 may clear the status of the validation request. The process concludes at step 89.

Figure 4:
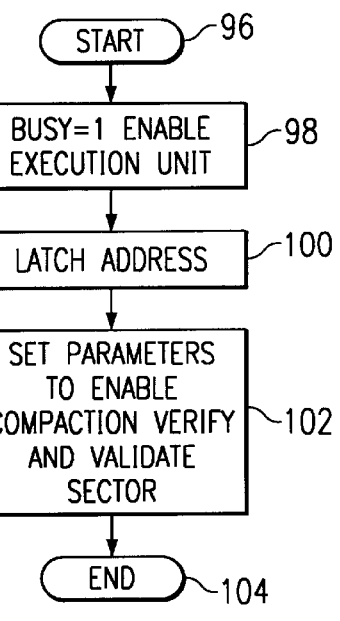
FIG. 4 is a flow chart illustrating steps performed by the validate sector setup unit of FIG. 3A.

FIG. 4 is a flow chart illustrating steps performed by validate sector setup unit 82. The process begins at step 96. At a step 98 a "BUSY" flag is set to "1", which enables execution unit 92. At a step 100, the address of the sector of flash memory to be validated, which is provided by host 70, 72, is latched, storing it for later use by execution unit 92. At a step 102, a plurality of parameters are set to enable execution unit 92 to execute procedures used to validate a particular sector. In this example, three parameters (not explicitly shown) are set. A first parameter, represented by "WSMODE," is set to designate that a compaction verify routine is to be executed by execution unit 92. Other possible designations for this first parameter are as follows: read, program verify, program, erase verify, erase, and compaction. A second parameter, represented by "WSMCMD," designates for execution unit 92 that a validate sector operation is to be performed. Other possible designations for this parameter are as follows: program word, erase sector, and program sector. The third parameter, specified by the name "REDMODE," is set to designate normal operation. Other possible designations for this parameter are: disable or enable redundant rows. The setup procedure executed by validate sector setup unit 82 concludes at step 104. These three parameters set at step 102 are used by execution unit 92 in validating the designated sector of memory, as described below in conjunction with FIG. 5.

Figure 5:
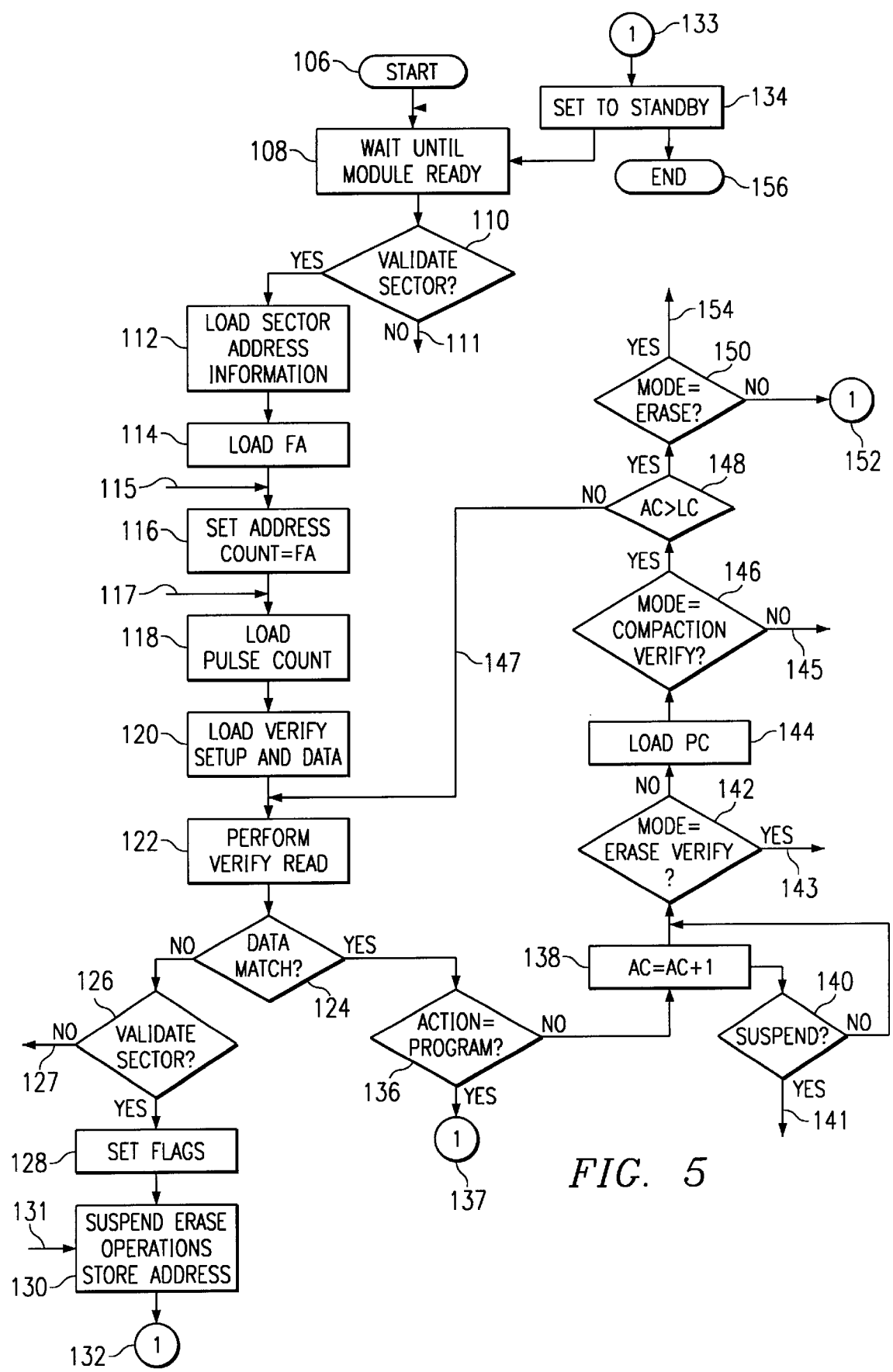
FIG. 5 is a flow chart illustrating steps performed by the execution unit of FIG. 3A while performing a sector validation in response to steps implemented by the validate sector setup unit of FIG. 3A.

FIG. 5 is a flow chart illustrating steps performed by the execution unit 92 while validating a portion of flash memory in response to steps implemented by validate sector setup unit 82. The process of validating a sector begins at step 106. At a step 108, execution unit 92 waits until the "BUSY" parameter is set to "1". The "BUSY" parameter is set to "1" when host 70, 72 designates that an operation is to be performed on flash module 14. An example operation is the validation of a sector of flash memory module 14. At a step 110, a determination is made of whether a validate sector operation is to be performed, which depends on the operation requested by host 70, 72. If it is, processing continues at step 112. If not, processing associated with one of the above-described operations continues, as designated by arrow 111. For simplicity of description, these additional processing steps are not explicitly illustrated. However, many of the alternative operations also utilize the same steps illustrated below. Locations at which the alternative operations merge with, or depart from, the illustrated steps used in conjunction with sector validation are illustrated in FIG. 5 by arrows 111, 115, 117, 127, 131, 137, 141, 143, 145, and 151.

At step 112, address information associated with the address latched at step 100 (FIG. 4) is loaded. At step 114, FA is loaded. FA denotes the first address of sector. At a step 116, an address count is set to FA. The address count designates the current address in the address counter. At a step 118, a pulse count is loaded. At step 116, a miscellaneous counter is also set to zero. In this instance, where the sector is to be validated, 0's are loaded. At a step 122, the data loaded at step 120 are read. At a step 124, a determination is made of whether the data loaded at step 120 match the data read at step 122. If the data did not match, indicating a depleted bit, processing continues at step 126. If the data did match, indicating no depleted bits in the written-to portion of the sector to be validated, processing continues at step 136.

In the case that the data did not match, processing continues as follows: A check is made at step 126 of whether the mode of operation is validation of a sector. In this case it is, so processing continues at step 128; however, if it were not, processing would continue at step 127 (additional details not explicitly shown). At step 128, particular flags are set, indicating an invalid sector exists. At a step 130, a parameter suspending erase operations is enabled and the address of the invalid sector is stored. Processing continues, through connectors 132 and 133 to step 134. At step 134, processing returns to the standby state. A status register is also set at step 130 indicating that a sector is invalid. Upon return of an invalid sector, the operator of host 70, 72 should execute an erase operation on the invalid sector prior to erasing any other sectors in the flash memory. Alternatively, execution of such an erase command may be programmed to take place automatically. In this manner, the sector containing a depleted bit may be properly erased.

If the data did match at step 124, indicating that no depleted bits exist in a particular portion of the sector to be validated, the remainder of the sector is validated as follows: A determination is made at step 136 of whether a particular parameter designates the operation is a programming operation. In this case, it is not, so processing continues at step 138; however, if it were, processing would continue as designated by arrow 137. At step 138, an address count is incremented. The address count stores the word address for a particular sector. At a step 140, a determination is made of whether a particular operation, such as erase or word program has been suspended. If so, processing continues along arrow 141. When executing a validate sector command, however, this step 140 is not executed. Processing therefore continues at step 142 where a determination is made of whether an erase verify operation is being performed. If so, processing continues along arrow 143. In this case, it is not, so processing continues at step 144, where a pulse count is loaded. This pulse count is the same as that loaded at step 118. At step 146, a determination is made of whether the operation is a compaction verification operation. In this case, the second parameter set at step 102 designated an operation of compaction verify; therefore, processing continues at step 148. If the mode were not compaction verify, then processing would continue at arrow 145. At step 148, a determination is made of whether the address count exceeds the last column address in a sector, indicating the entire sector has been validated. If it has, then at step 150 a determination is made of whether execution unit 92 is operating in an erase mode. If it is, processing continues at step 154. If not, processing is concluded through connectors 152 and 133 at step 134. Thus, after writing to each address in a sector and reading the written data to verify that the written data matches the read data, the sector is validated and has no depleted bits.

At step 148, if the address count does not exceed the last column address, indicating the entire sector has not yet been validated, step 122 is executed for that address and processing continues as described above.

Thus, the process of FIG. 5 determines that a particular sector is to be validated and performs a compaction (writes data) on that sector. Compaction verify is then performed on each column of that sector to confirm the sector is not in depletion. If any of the columns show depleted bits, then the process is interrupted and registers are set to indicate that a compaction routine is necessary for that sector. In this implementation, the compaction routine is also implemented through the erase command. As demonstrated, a number of the functions utilized are not specific to the validate sector operation. Thus, according to the teachings of the invention, the validate sector operation is incorporated with an existing system in a manner that allows a sector to be validated without executing an erase operation to perform the validation procedure.

Although the present invention and its advantages have been described in detail, it should be understood that various changes, substitutions, and alterations can be made therein without departing from the spirit and scope of the present invention as defined by the appended claims.

What is claimed is:

1. A flash memory module comprising:
   a flash bank comprising a plurality of sectors of flash memory; and
   a flash memory control circuit comprising a flash state machine, the flash state machine for controlling a plurality of operations on the flash memory, the flash state machine comprising:
      a stand-by unit for monitoring the state of at least one variable and initiating execution of a particular one of a plurality of setup units in response to the state of the at least one variable;
      an execution unit operable to selectively perform each of the plurality of operations in response to the state of a plurality of parameters, including validating a designated sector of the flash memory;
      a validation setup unit operable to set the plurality of parameters such that the execution unit validates a designated portion of the flash memory; and
      a plurality of additional setup units, each operable to set the plurality of parameters such that the execution unit performs a respective one of the plurality of operations.

2. The flash memory module of claim 1, and further comprising a plurality of flash banks.

3. The flash memory module of claim 1, wherein the plurality of additional setup units comprises an erase setup unit operable to set the plurality of parameters such that the execution unit performs a program operation.

4. The flash memory module of claim 1, and further comprising a charge pump.

5. The flash memory module of claim 1, wherein the plurality of additional setup units comprises an erase setup unit operable to set the plurality of parameters such that the execution unit performs an erase operation.

6. The flash memory module of claim 5, wherein the erase setup unit is further operable to set the plurality of parameters such that the execution unit further validates an erase memory.

7. A method for validating flash memory comprising:
   selecting for execution and executing, from a plurality of setup procedures available for the memory, a memory validation setup procedure setting respective values for a plurality of parameters that are also parameters set by execution of the other of the plurality of setup procedures;

determining that validation of a particular sector of the flash memory is desired; and validating the particular sector of the flash memory, including examining the values of the plurality of parameters.

8. The method of claim 7, wherein selecting for execution and executing a memory validation setup procedure comprises selecting for execution and executing a memory validation setup procedure in response to providing power to the flash memory.

9. The method of claim 7, wherein selecting for execution and executing a memory validation setup procedure comprises selecting for execution and executing a memory validation setup procedure in response to providing power to the flash memory in response to providing an inadvertent system reset to the flash memory.

10. The method of claim 7, and further comprising:

in response to validating the particular sector, selecting for execution and executing, from the plurality of setup procedures, an erase setup procedure setting respective values for the plurality of parameters; and in response to execution of the erase setup procedure, erasing the particular sector.

11. The method of claim 7 or claim 9, wherein validating the particular sector comprises determining that the particular sector has not been properly erased.

12. The method of claim 7, wherein validating the particular sector comprises determining that the particular sector has been properly erased.

13. The method of claim 7, wherein the plurality of parameters comprises a parameter designating an operation to be performed on the particular sector.

14. The method of claim 7, and further comprising executing a plurality of the plurality of setup procedures after executing the memory validation setup procedure.

15. The method of claim 7, and further comprising specifying an address for the particular sector of flash memory for which validation is desired.

16. A method for facilitating validation of flash memory comprising:

making available for execution a plurality of setup procedures having a plurality of common parameters, including providing a validation setup procedure operable to set the plurality of common parameters for use in validating the flash memory;

receiving an indication that validation of a portion of the flash memory is desired and in response executing the validation setup procedure, including setting the plurality of common parameters; and in response to setting the plurality of common parameters, validating a portion of the flash memory.

17. The method of claim 16, wherein making available for execution a plurality of setup procedures having a plurality of common parameters comprises making available for execution a plurality of setup procedures having a plurality of common parameters in response to providing power to the flash memory.

18. The method of claim 16, making available for execution a plurality of setup procedures having a plurality of common parameters comprises making available for execution a plurality of setup procedures having a plurality of common parameters in response to providing power to the flash memory providing an inadvertent system reset to the flash memory.

19. The method of claim 16, wherein validating a portion of the flash memory comprises determining that the portion has not been properly erased prior to start-up.

20. The method of claim 16, wherein validating a portion of the flash memory comprises determining that the portion has been properly erased prior to start-up.

* * * * *